United States Patent [19]
Groves et al.

[11] Patent Number: 5,030,110
[45] Date of Patent: Jul. 9, 1991

[54] CASE ASSEMBLY FOR STACKING INTEGRATED CIRCUIT PACKAGES

[75] Inventors: Henry T. Groves, Camarillo; Frank R. Hultberg, Tujunga; John A. Klacks, Canoga Park, all of Calif.

[73] Assignee: Litton Systems, Inc., Beverly Hills, Calif.

[21] Appl. No.: 432,158

[22] Filed: Nov. 6, 1989

[51] Int. Cl.$^5$ .............................................. H01R 9/09
[52] U.S. Cl. ...................................... 439/69; 361/393; 439/75
[58] Field of Search ................. 439/68, 69, 74, 75; 361/393–398, 403; 174/52.4; 29/840, 830, 847

[56] References Cited

U.S. PATENT DOCUMENTS

| | | | |
|---|---|---|---|
| 3,205,298 | 9/1965 | Kalt | 361/393 |
| 3,262,023 | 7/1966 | Boyle | 361/393 |
| 3,696,323 | 10/1972 | Kinkaid et al. | 439/525 |
| 4,169,642 | 10/1979 | Mouissie | 439/68 |
| 4,231,154 | 11/1980 | Gazdik et al. | 29/847 |
| 4,520,427 | 5/1985 | Brotherton | 361/389 |
| 4,595,794 | 6/1986 | Wasserman | 361/403 |
| 4,696,525 | 9/1987 | Coller et al. | 439/69 |
| 4,871,317 | 10/1989 | Jones | 29/840 |

OTHER PUBLICATIONS

IBM Bulletin, Roche et al., vol. 6, No. 8, p. 87, 1–1964.

*Primary Examiner*—Neil Abrams

[57] ABSTRACT

A cage assembly for stacking one or more PRIOR ART integrated circuit packages or leadless chip carriers (LCC), and for electrically and mechanically interconnecting the LCCs selectively to each other and to a PRIOR ART printed circuit board (PCB). The cage assembly includes a flexible wafer with an electrical conductor pattern that is electrically and mechanically connected to an LCC positioned thereon, is mechanically retained by a rigid cage member. The cage member electrically interconnects the one or more LCCs positioned in a stacked relationship, and can be electrically and mechanically connected to a PCB.

7 Claims, 4 Drawing Sheets

CASE ASSEMBLY FOR STACKING INTEGRATED CIRCUIT PACKAGES

BACKGROUND OF THE INVENTION

1. Field of the Invention

One or more PRIOR ART integrated circuit packages or leadless chip carriers (LCC) are positioned in a stacked relationship, and are electrically and mechanically interconnected to a PRIOR ART printed circuit board (PCB) by a cage assembly that includes a cage member and at least one flexible interconnect wafer which cooperate to constrain and support the associated LCC.

2. Description of the Related Art

The ongoing evolution of computer architecture represents, inter alia, a continuing improvement in the total computer memory available in a constantly shrinking volume of useable space. This evolution continues to demand increased computer memory in reduced space.

U.S. Pat. No. 4,696,525 is an example of increased memory in less space. Patent '525 teaches the use of one form of socket for stacking and interconnecting the leads of one form of a pair of LCCs; see also U.S. Pat. No. 4,682,270 for another form of LCC. Known LCCs electrically and mechanically interconnect a semiconductor chip, which is contained by or housed within the LCC, to a PRIOR ART printed circuit board (PCB) using either conventional surface-mounted or through-hole technology. It is recognized that surface-mounted components result in the use of less space on a PCB. See ELECTRONIC BUSINESS, p 130 (Sept. 15, 1986). The Patent '525 socket has compliant terminals that function like opposed spring clips to retain the LCCs, and to compensate for "thermal expansion", i.e., temperature induced stresses.

The '525 Patent also teaches that its stacking concept can be used to combine various computer architecture functions such as a microprocessor and a memory unit. However, as noted at Columns 1 and 2, the connection and interconnection of certain leads in the stack assembly can create complications, e.g., where a lead on one LCC in the stack must be "commoned to a lead on the opposite side" of a second LCC. At Column 4, the '525 Patent teaches a jumper portion 70 is molded in the socket, and selected connector tabs are sheared so that nondesired leads of the respective packages/LCCs are not commoned. Thus, mold and shear operations are a requirement in accordance with the teachings of the '525 Patent to tailor a socket for a particular LCC as determined by the LCC chip parameters.

SUMMARY OF THE INVENTION

Briefly, in accordance with the invention, a cage assembly positions and retains one or more leadless chip carriers (LCC), each of which contain at least one discrete electronic component such as an integrated circuit chip, in a stacked relationship, and to mechanically and electrically interconnects the LCC's in a selected manner to each other and, finally, with a printed circuit board (PCB). The cage assembly (10) of the invention includes a cage member (12), which can be mechanically and electrically connected to a PCB, and at least one flexible interconnect wafer (14), which mechanically and electrically interconnects an LCC positioned on the wafer to the cage member. The flexible wafer compensates for mechanical and thermal stresses imposed upon the system.

Accordingly, one object of the invention is to increase the total number of electronic components that can be stacked per unit volume of space.

Another object of the invention is to electrically and mechanically interconnect a cage assembly with one or more LCCs, and to match the physical gradients of each while compensating for mechanical and thermal stresses imposed upon the cage assembly.

Another object of the invention is to facilitate placing one or more LCCs in a stacked relationship on a PCB either by surface mounted or through-hole mount technology.

Another object of the invention is to provide all electrical interconnects between a number of stacked LCCs separate from a socket or cage member body.

Another object of invention is to provide all electrical interconnects between a number of stacked electrical components where each can have a separate and distinct system function that is selectively electrically interconnected within the stack.

Further objects, features, and the attending advantages of the invention will be apparent when the following description of the invention is read with the accompanying drawings.

DESCRIPTION OF THE PREFERRED EMBODIMENTS

Figure 1:
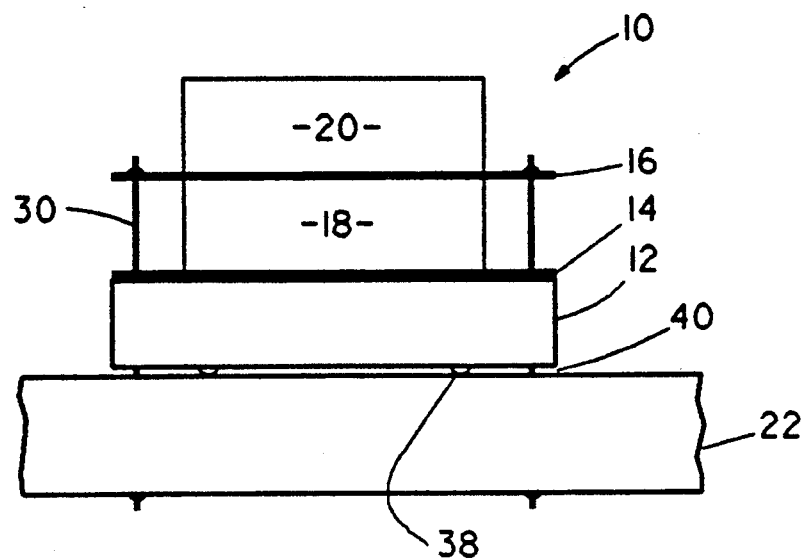
FIG. 1 is an assembled front view of the cage assembly of the invention in a stacked and mounted relationship with a PRIOR ART PCB, partly broken away.

In one embodiment of the invention, a cage assembly 10 as shown by FIG. 1 includes a rigid cage member 12, flexible interconnect insulators or wafers 14 and 16, and PRIOR ART LCCs 18 and 20, all in a stacked relationship. In operation, the cage assembly can be mounted on or to a PRIOR ART PCB 22.

Figure 2:
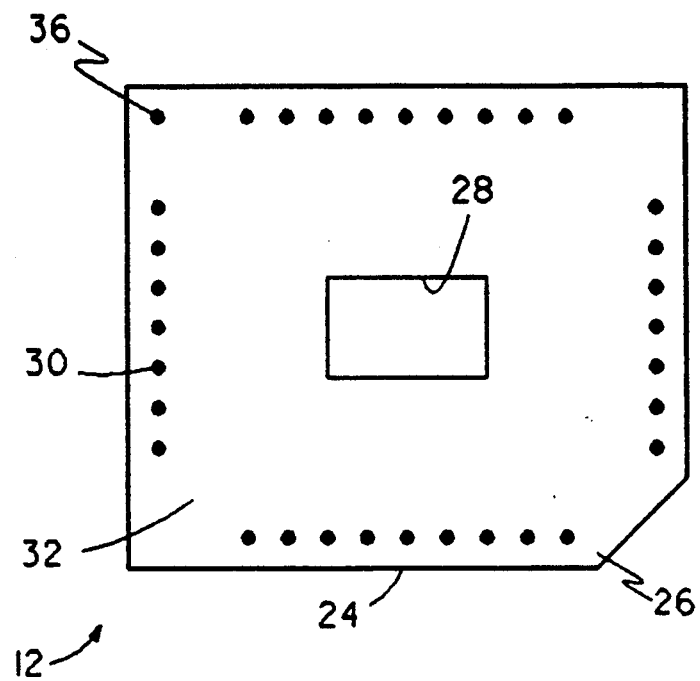
FIG. 2 is a plan view of the obverse surface of the cage or socket member of the cage assembly of FIG. 1.

The cage member 12, particularly as shown by FIGS. 1 and 2, has a body or foundation portion 24 formed from an electrical insulator material such as ceramic or plastic. A chamfered corner 26 of the body facilitates visual orientation and can function as a mechanical guide in assembly. A clear opening or aperture 28 in the body portion is adapted to receive a discrete component (not shown), such as a decoupling capacitor, which is essentially "buried" in the body so that the component's height does not add to the total height of the stacked cage assembly 10.

The cage body 24 has plurality of similar pin terminals, such as pin terminal 30, spaced along and adjacent to the perimeter edge of the cage body. The pin terminals extend outwardly from the obverse surface 32 and reverse surface 34 (see FIG. 3) of the cage body. In this embodiment, the cage assembly 10 is connected to the PCB 22 by a conventional through-hole mount process. Where the cage assembly 10 is intended for use in a conventional surface-mounted process, the pin terminals 30 of the cage member 12 at the reverse surface 34 would have a terminal or contact portion suitably configured for mechanical bonding or joining to the complementary contact pads of a PCB; for example, see U.S. Pat. No. 4,696,525.

The total number of pin terminals 30 for the final cage assembly 10 is determined by the particular LCC received and retained by the cage member 12. The number of pin terminals on each side of the cage body 24 can be, for example, a 7-by-9 pin terminal configuration as shown by FIG. 2.

The total number of pin terminals, therefore, can vary; however, in accordance with the invention, at least one locator pin terminal 36 is positioned relative to the chamfered corner 26 of the cage body. The physical relationship between pin terminal 36 and chamfered corner 26, which is preferably positioned on a diagonal in this embodiment, can be used both as a visual orientation and mechanical guide in the assembly of the components that combine to form the cage assembly 10.

The pin terminals 30 can be formed from a relatively stiff, noncorrosive metal wire that exhibits a resiliency to mechanical forces which may be imposed upon the pin terminals during assembly and use of the cage assembly 10. Selected ones or all of the pin terminals can be pre-tinned in a conventional manner for ease of joining, e.g., soldering, with other components during final assembly.

Figure 3:
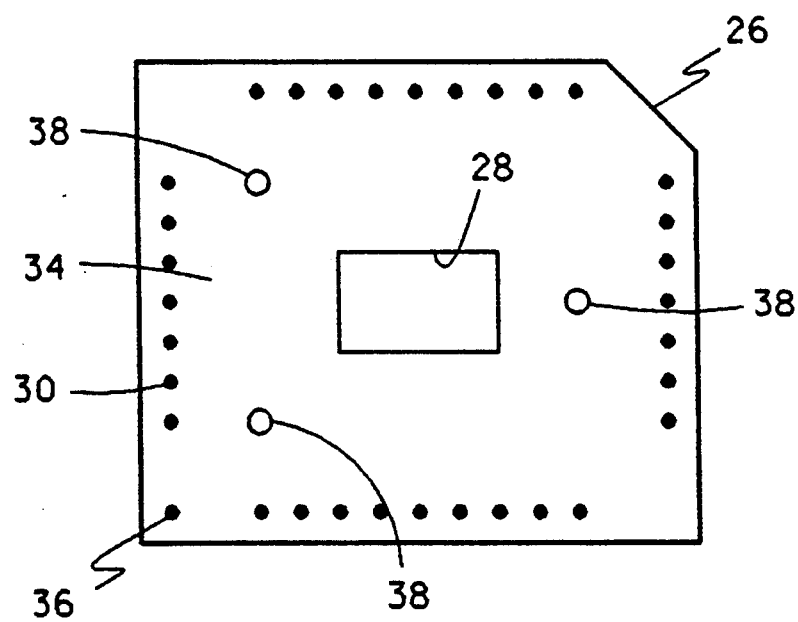
FIG. 3 is a plan view of the reverse surface of the cage of FIG. 2.

The reverse surface 34 of the cage body 24, as shown by FIG. 3, has similar spacer bumps 38. These spacer bumps, particularly when arranged in a triangular pattern as shown, provide a stable contact plane between the cage body 24 and the PCB 22 or other adjacent support. The spacer bumps also develop a gap 40 (see FIG. 1) between the cage body 24 and PCB 22 that facilitates cleaning, the complete conformal coating of the components, and the like when such are required for the cage assembly. Properly sized, the width of the gap can also function to facilitate airflow through and enhance cooling of the cage assembly 10.

Figure 4:
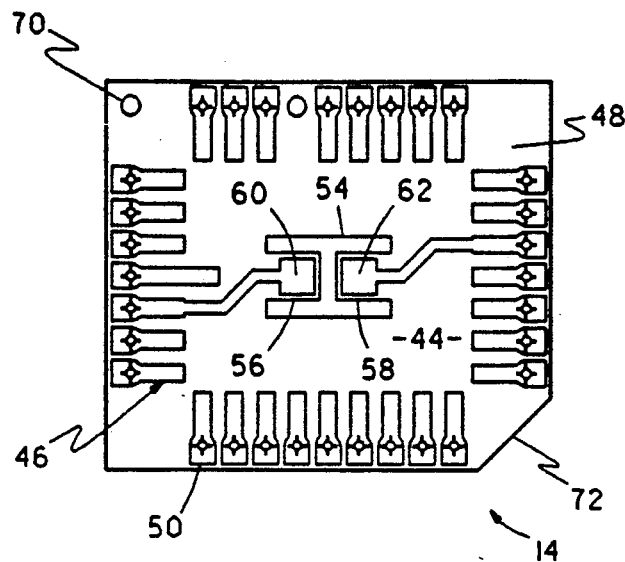
FIG. 4 is a plan view of one of the flexible interconnect wafers of FIG. 1 with a partial schematic of one conductor pattern.
Figure 5:
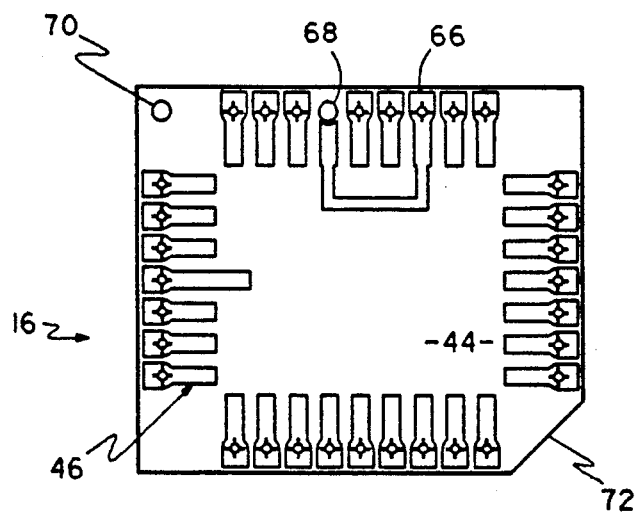
FIG. 5 is a plan view of a second of the flexible interconnect wafers of FIG. 1 with a partial schematic of one conductor pattern.

FIGS. 4 and 5 show, in selected detail, the interconnect insulators or wafers 14 and 16, respectively, of the cage assembly 10 of FIG. 1. Each of the wafers 14 and 16 has a carrier member 44 (for example, see U.S. Pat. No. 4,721,993) formed from a flexible plastic material, such as Kapton (Kapton is a registered trademark of the DuPont Co.), and has a planar geometry selected to complement the geometry of the cage member 12; in particular, that of the cage body portion 24 and its similar pin terminals 30. Each wafer has a selected conductor pattern of interconnect leads 46 formed, using known semiconductor masking processes, from an electrically conductive cladding material or metal, such as copper, on a first or obverse surface 48 of the carrier member. Each of the interconnect leads or conductors 46 has a pin terminal portion 50 that complements the terminal pin 30 as will be described. The resulting interconnect leads on each wafer are patterned so that the cage assembly 10 operates as designed.

A configured aperture 54 in the wafer 14 of FIG. 4 develops opposing flexible tabs 56 and 58. The configured aperture 54 complements the physical dimensions of the clear aperture 28 in the cage member 12 as shown by FIGS. 2 and 3.

Figure 6:
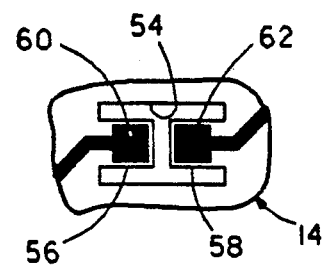
FIG. 6 is an enlarged view, partly broken away, of a configured aperture in a portion of the wafer of FIG. 4.

Both the configured aperture 54 and the clear aperture 28 are sized to cooperate and receive a discrete electronic component, such as a decoupling capacitor (not shown). The patterned interconnect leads of wafer 14 are formed on tabs 56 and 58 into a special contact pad or terminus portions 60 and 62, respectively, as more clearly shown by FIG. 6. The tabs 56 and 58 are designed to flex into the clear aperture of the cage body 24, and urge each of the special contact pads 60 and 62 into good electrical and mechanical contact with the "buried" discrete component. For example, the special contact pads can connect a capacitor across the voltage input and ground for the cage assembly of the invention. It is contemplated that an interconnect wafer can have one or more configured apertures, functionally similar to aperture 54, to complement a corresponding aperture or cavity in an associated body portion of a cage member.

Interconnect wafer 16 of FIG. 5 is substantially similar to the wafer 14 as described; however, only one wafer need have a central, configured aperture 54 as has been described for wafer 14.

It is expected and understood that each wafer, like wafers 14 and 16, when used in a stacked assembly of LCCs will have the required conductor pattern 46 for its particular layer position in the assembled stack to complete the electrical interconnect of the circuit design. For example, wafer 16 has a pattern of interconnect leads 46 that electrically connect a contact pad and pin (not shown) at pin position 66 with a contact pad only at pin position 68.

In the present invention, all electrical interconnections between the pin terminals are made by and through the particular conductor pattern formed on each interconnect wafer, here wafers 14 and 16, that are used in the cage assembly 10. Electrical interconnections are not made through conductors formed on or within the cage body 24; however, this is contemplated in combination with the cage assembly 10 of the invention when such is functionally and structurally desired.

Each of the interconnect wafers 14 and 16 has a clear locator hole 70 positioned diagonally opposite a chamfered corner 72 to facilitate both the visual orientation and physical alignment, including jigging, of the wafer to the locator pin 36 and chamfered corner 26, respectively, of the cage body 24.

In the embodiment described, the material of the cage body 24 is selected to withstand the temperatures of vapor phase soldering and to act as an effective electrical insulator. The flexible interconnect wafers 14 and 16, like miniature trampolines, give or yield to compensate for temperature created dimensional changes in the cage body, and for any physical distortions caused by applied or developed mechanical forces such as stretching, contracting, flexing, and the like.

Figure 7:
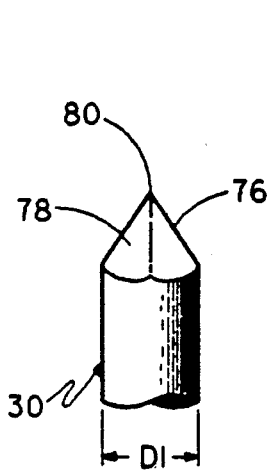
FIG. 7 is an enlarged, perspective view, partly broken away, of one pin end of the pin terminals of FIG. 1.

Referring to FIG. 7, each pin terminal 30, with a diameter or major dimension D1, carried by the cage body (not shown) has a pin end 76 that is formed to develop a plurality of facets, such as facet 78, which terminate in a pin point or tip 80. The pin terminals are formed from a relatively stiff material, such as a phosphor-bronze wire, that has a good spring characteristic so that it is not only strong but also resilient. When soldering is selected as the method of joining during assembly of the cage member 12, the pin terminals can be plated with an appropriate solderable material; for example, a tin plating on a phosphor-bronze pin terminal.

In the embodiment shown by FIG. 7, pin end 76 has four facets, all like facet 78, that develop a pyramid configuration having as its apex the point 80. Of course, three facets are also possible, as are five. Such facets are not critical to the invention but are preferred.

Figure 8:
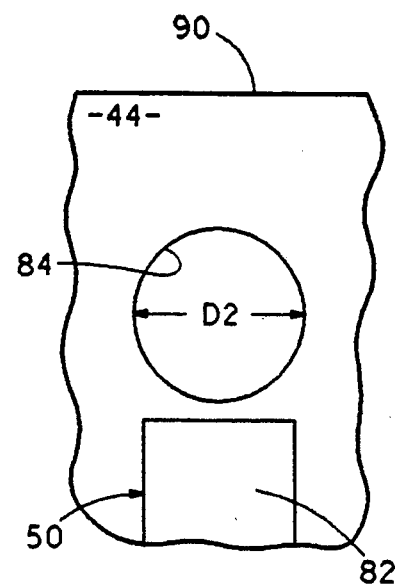
FIG. 8 is an enlarged plan view, partly broken away, of one form of pin terminal portion of the conductor patters on the wafers of FIGS. 4 and 5.
Figure 9:
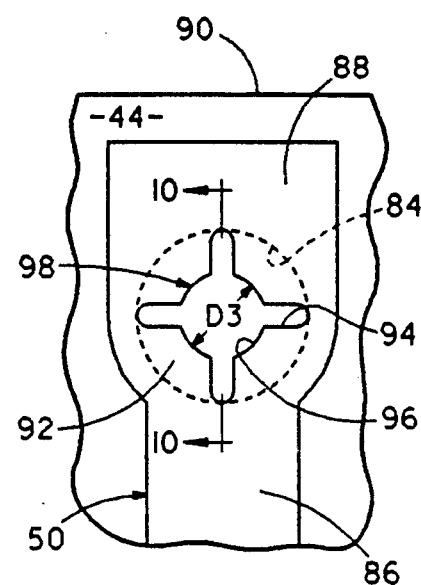
FIG. 9 is an enlarged plan view, partly broken away, of another form of pin terminal portion of the conductor patterns on the wafers of FIGS. 4 and 5.

Referring now to FIGS. 8 and 9, the conductor pattern of interconnect leads 46 on a wafer has several pin terminal portions 50, as shown by FIGS. 4 and 5, formed in accordance with the invention.

One form of pin terminal portion 50 is shown by FIG. 8. Contact pad portion 82, to which a corresponding LCC contact pad can be joined, is spaced apart from a clear hole 84 that is formed through the wafer carrier member 44. The clear hole 84 has a major dimension or diameter D2.

In the cage assembly 10, a pin terminal 30 associated with clear hole 84 can pass easily through the clear hole when D1<D2, and will not make electrical contact with the pad portion 82 because of the spacing therefrom. However, the pin terminal can be in electrical contact with a second form of pin terminal portion 50 (see FIGURE 9) on an adjoining wafer in a stacked cage assembly 10.

A second form of pin terminal portion 50 is shown by FIG. 9. Here the contact pad portion 86 has an expanded lip region 88 that extends nearly to the edge 90 of wafer carrier member 44. The lip region 88 overlays the clear hole 84 formed in the wafer. This expanded lip region 88 resists delamination of the cladding material, which forms the conductor pattern of interconnect leads 46, that can result from the physical act of pin engagement during assembly as well as use of the cage assembly 10. The lip region 88 has a plurality of similar, wedge segments 92 that are developed by a plurality of equally spaced, radially extending slots 94. Each of these segments 92 has a similar, arcuate edge 96 that in combination generally define a pilot aperture 98 having a major dimension or diameter D3.

Figure 10:
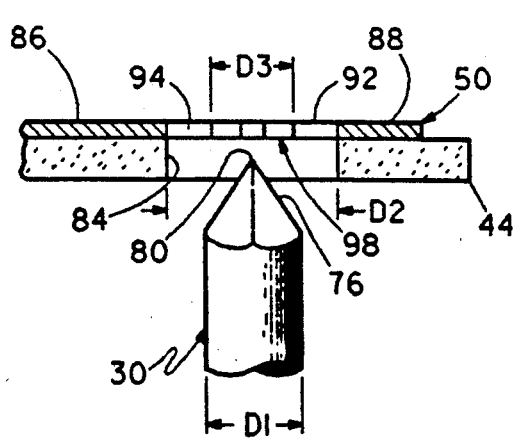
FIG. 10 is an enlarged sectional view along the line 10—10 of FIG. 9 in an unassembled relationship with the pin end of FIG. 7.
Figure 11:
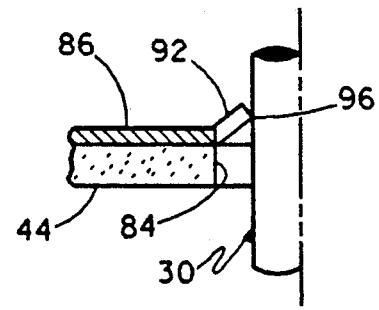
FIG. 11 is an enlarged assembled sectional view, partly broken away, of FIG. 10 in an assembled relationship.

In assembling an interconnect wafer, such as wafer 14 or 16 to the cage body 24, the tip 80 of a pin terminal 30 enters the pilot aperture 98 and "pierces" or penetrates the terminal portion 50 as more clearly shown by FIGS. 10 and 11. The segments 92 flex outwardly from the plane of the wafer since the dimension D1 of the pin end 76 is sized to be greater than the dimension D3 of the pilot aperture 98. The arc edge 96 of each segment mechanically engages and grips the outer circumferential surface of the pin terminal 30, under the reactive force of the deflected cladding material, to complete the desired electrical junction. This mechanical joint can then be enhanced by the conventional application of solder to join the pin terminal portion 50 to the pin. In view of this, the clear hole 84 does not have to be plated with cladding material as is known with conventional plated vias through a PCB.

Figure 12:
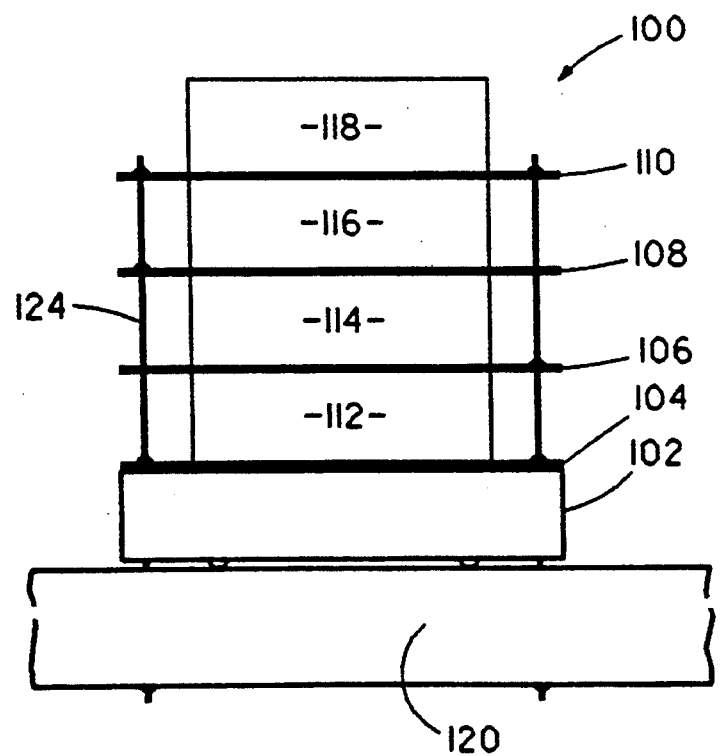
FIG. 12 is an assembled front view of another form of the cage assembly of the invention in a stacked and mounted relationship with a PRIOR ART PCB, partly broken away.

In a second embodiment of the invention, a cage assembly 100 as shown by FIG. 12, includes a rigid cage member 102, flexible interconnect wafers 104, 106, 108 and 110, and PRIOR ART LCCs 112, 114, 116 and 118, mounted on a PRIOR ART PCB 120. The cage member 102 can have a body portion identical to that of the cage body portion 24 of FIGS. 1 through 3. However, pin terminals 124 which extend from the obverse surface are understandably longer to accommodate the total height developed by the increased number of LCCs in the stack of the cage assembly 100.

Similarly, wafer 104 can have a configured aperture (not shown, but similar to the configured aperture 54 in wafer 14 of FIG. 4) to complement a clear aperture in the cage body portion of the cage member 102. The remaining wafers 106, 108 and 110 are similar to wafer 16 of FIGURE 5 but each would have the necessary interconnect conductor pattern to complete the electrical interconnects between the several LCCs, wafers, and PCB. The structural configuration of the pin ends, pin terminal portions, and assembly are as described for FIGS. 7 through 11.

As will be evidenced from the foregoing description, certain aspects of the invention are not limited to the particular details of construction as illustrated, and it is contemplated that other modifications and applications will occur to those skilled in the art. It is, therefore, intended that the appended claims shall cover such modifications and applications that do not depart from the true spirit and scope of the invention.

We claim:

1. A cage assembly (10) that receives and positions at least one PRIOR ART LCC in an electrical and mechanical interconnection with a PRIOR ART PCB CHARACTERIZED IN THAT the cage assembly comprises:
   a) rigid cage member (12) which includes
      1) cage body (24) having obverse and reverse surfaces,
      2) plurality of pin terminals (30) extending through said cage body and outwardly from each of said surfaces, each of said pin terminals (30) includes
         i) pin end (76),
         ii) apex or tip (80) on said pin end,
         iii) a plurality of facets (78) that develop said pin end,
      3) a locator pin (36),
      4) a chamfered corner (26),
      5) aperture (28),
      6) spacer bumps (38) on said reverse surface of said cage body that abut the adjacent surface of the PCB and thereby develop a gap (40) between the respective surfaces;
   b) wafer (14) which includes
      1) flexible carrier member (44) that is an electrical insulator having an obverse surface (48),
      2) plurality of clear holes (84) in said carrier member,
      3) an electrical conductor pattern (46) having terminal portions (50) on said obverse surface which further includes:
         i) contact pad (82) adjacent to and spaced apart from selected ones of said clear holes, ii) contact pad (86) with an extended lip region (88) that overlies remaining ones of said clear holes, the extended lip region includes:
   aa) a plurality of radially-extending slots (94),
   bb) wedge segments (92) developed by and between said slots where said segments substantially overlie an associated one of said clear holes,
   cc) each of said segments having an arcuate edge (96) whereby said combined edges of said segments define a pilot aperture (98) that overlies the approximate center of said associated clear hole,
4) locator hole (70),
5) chamfered corner (72) diagonally opposite said locator hole, and
6) configured aperture (54) which further includes:
   i) a pair of opposing flexible tabs (56, 58) as part of said configured aperture extending into the aperture region defined by said configured aperture,
   ii) respective ones of contact pads (60, 62) on associated ones of said tabs (56, 58)m, and
c) wafer (16) which includes
1) flexible carrier member (44) that is an electrical insulator having an obverse surface (48),
2) plurality of clear holes (84) in said carrier member,
3) an electrical conductor pattern (46) having a terminal portion (50) on said obverse surface which further includes:
   i) contact pad (82) adjacent to and spaced-apart from selected ones of said clear holes,
   ii) contact pad (86) with an extended lip region (88) that overlies remaining ones of said clear holes, the extended lip region further includes:
   aa) a plurality of radially-extending slots (94),
   bb) wedge segments (92) developed by and between said slots where said segments substantially overlie an associated one of said clear holes,
   cc) each of said segments having an arcuate edge (96) whereby said combined edges of said segments define a pilot aperture (98) that overlies the approximate center of said associated clear hole,
4) locator hole (70), and
5) chamfered corner (72) diagonally opposite said locator hole so that a first LCC mechanically and electrically connected to the conductor pattern (46) of wafer (14), and a second LCC mechanically and electrically connected to the conductor pattern (46) of wafer (16) are visually oriented and mechanically positioned relative to the cage member (12) by matching the associated chamfered corner (26, 72) and by inserting locator pin (36) through the locator holes (70) of each of the wafers (14) and (16) and mechanically retained by penetration of each pin end (76) through its associated pilot aperture (98) whereby the wedge segments (92) are flexed outwardly from the obverse surface (48) of each of the wafers (14) and (16) so that the arcuate edge (96) of each segment grips the outer surface of the corresponding pin terminal (30) resulting in a completed cage assembly (10) that can be mechanically and electrically connected to the PCB.

2. The cage assembly of claim 1 in which said locator pin (36) is positioned relative to said chamfered corner (26) on said cage body (24), and in which said locator hole (70) in each of said wafers (14, 16) is identically positioned relative to said chamfered corner (72) on respective ones of said wafers (14, 16) as said locator pin (36) is to said chamfered corner (26).

3. The cage assembly of claim 1 in which said plurality of spacer bumps are three spacer bumps positioned in a triangular pattern.

4. The cage assembly of claim 1 in which said plurality of clear holes (84) in each of said wafers (14, 16) are identically positioned and selectively spaced-apart along a perimeter edge of each of said wafers (14,16) to complement the spacing of said pin terminals (30).

5. The cage assembly of claim 1 in which each pin terminal is formed from a relatively stiff wire and includes
   a) a pin end (76), and
   b) an apex or tip (80) formed on said pin end has a plurality of tip facets (78).

6. The cage assembly of claim 5 in which said pin terminal (30) has a major cross section dimension greater than a major plan dimension of said pilot aperture (98) where both of said terminal and aperture dimensions are each less than a major plan dimension of said clear hole (84).

7. The cage assembly of claim 1 in which said pin terminal (30) is further mechanically joined to said lip region (88) by a solder joint at said contact pad (86).

* * * * *